(12) United States Patent
Akram et al.

(10) Patent No.: US 7,385,412 B2
(45) Date of Patent: Jun. 10, 2008

(54) SYSTEMS AND METHODS FOR TESTING MICROFEATURE DEVICES

(75) Inventors: Salman Akram, Boise, ID (US);
William M. Hiatt, Eagle, ID (US);
Alan G. Wood, Boise, ID (US);
Charles M. Watkins, Eagle, ID (US);
Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 11/409,060

(22) Filed: Apr. 24, 2006

(65) Prior Publication Data

US 2006/0255826 A1 Nov. 16, 2006

Related U.S. Application Data

(62) Division of application No. 10/860,699, filed on Jun. 2, 2004, now Pat. No. 7,148,715.

(51) Int. Cl.
*G01R 31/02* (2006.01)
*G01R 31/26* (2006.01)
*H01L 27/00* (2006.01)

(52) U.S. Cl. .................. 324/765; 324/757; 324/753; 250/208.1; 438/17

(58) Field of Classification Search ........ 324/754–765; 250/208.1; 438/17
See application file for complete search history.

(56) References Cited

U.S. PATENT DOCUMENTS

| 6,734,419 | B1 | 5/2004 | Glenn et al. |
| 6,773,938 | B2 | 8/2004 | Wood et al. |
| 6,881,974 | B2 | 4/2005 | Wood et al. |
| 6,885,101 | B2 | 4/2005 | Storli |
| 6,946,325 | B2 | 9/2005 | Yean et al. |
| 2004/0035917 | A1 | 2/2004 | Koopmans |
| 2005/0206401 | A1 | 9/2005 | Caldwell et al. |
| 2006/0197544 | A1* | 9/2006 | Caldwell et al. ............ 324/757 |
| 2006/0255418 | A1* | 11/2006 | Watkins et al. ............ 257/432 |

* cited by examiner

*Primary Examiner*—Ha Tran Nguyen
*Assistant Examiner*—Emily Y Chan
(74) *Attorney, Agent, or Firm*—Dickstein Shapiro LLP

(57) ABSTRACT

Systems and methods for testing microelectronic imagers and microfeature devices are disclosed herein. In one embodiment, a method includes providing a microfeature workpiece including a substrate having a front side, a backside, and a plurality of microelectronic dies. The individual dies include an integrated circuit and a plurality of contact pads at the backside of the substrate operatively coupled to the integrated circuit. The method includes contacting individual contact pads with corresponding pins of a probe card. The method further includes testing the dies. In another embodiment, the individual dies can further comprise an image sensor at the front side of the substrate and operatively coupled to the integrated circuit. The image sensors are illuminated while the dies are tested.

20 Claims, 7 Drawing Sheets

SYSTEMS AND METHODS FOR TESTING MICROFEATURE DEVICES

CROSS-REFERENCE TO RELATED APPLICATION

This application is a divisional of application Ser. No. 10/860,699, filed on Jun. 2, 2004, now U.S. Pat. No. 7,148,715, which is incorporated herein by reference in its entirety.

TECHNICAL FIELD

The present invention is related to systems and methods for testing microelectronic imagers and microfeature devices.

BACKGROUND

The microelectronics industry is highly competitive and microelectronics manufacturers are very sensitive to quality and cost considerations. Most microelectronics manufacturers require that suppliers of microelectronic components test the performance of each microelectronic component before shipment to minimize the manufacturer's product losses. For example, microelectronic imagers are commonly tested by establishing temporary electrical connections between a test system and electrical contacts on each microelectronic imaging die while simultaneously exposing an image sensor on the device to light.

One way of establishing a temporary electrical connection between the test system and the contacts on a microelectronic component employs a probe card carrying a plurality of probe pins. The probe pins are typically either a length of wire (e.g., cantilevered wire probes) or a relatively complex spring-biased mechanism (e.g., pogo pins). The probe pins are connected to the probe card and arranged in a predetermined array for use with a specific microelectronic component configuration. For example, when testing a microelectronic imager with a conventional probe card (whether it be a cantilevered wire probe card, a pogo pin probe card, or another design), the probe card is positioned proximate to the front side of the imaging die to be tested. The probe card and the imaging die are aligned with each other in an effort to precisely align each of the probe pins of the probe card with a corresponding electrical contact of the front side of the imaging die.

One problem with testing imaging dies at the wafer level is that it is difficult to expose an image sensor to light while simultaneously aligning the probe pins or the body of the probe card with the corresponding electrical contacts on the front side of the imaging die. For example, because the probe card is positioned over the image sensor to contact the front side bond-pads on the die, the probe card must have a plurality of holes or apertures through which light can pass. This limits wafer-level testing methods because the physical constraints of probe card structures and the limited testing area available on the wafer. Further, the probe card and/or probe pins positioned proximate (but not over) the image sensor also interfere with the light directed to the image sensor (e.g., shadowing, reflections). These limitations result in the ability to test only a fraction of the imaging dies on a wafer of imaging dies as compared to the number of other types of dies that can be tested in non-imaging applications (e.g., memory, processors, etc.). For example, only four CMOS imaging dies can be tested simultaneously on a wafer compared to 128 DRAM dies using the same equipment. Accordingly, there is a need to improve the efficiency and throughput for testing imaging dies.

Another problem with conventional probe card testing methods is that the testing process can introduce moisture and/or other contaminants to the image sensors. For example, conventional probe cards and/or probe pins are positioned over the image sensors to contact the bond-pads on the front side of the dies. Accordingly, tiny particles generated during the testing process or otherwise on the probe pins can fall onto the image sensors. This can cause a malfunction or failure because a particle as small as ten microns can effectively ruin an image sensor. Accordingly, there is a further need to improve the testing of imaging dies.

DETAILED DESCRIPTION

A. Overview

Figure 1:
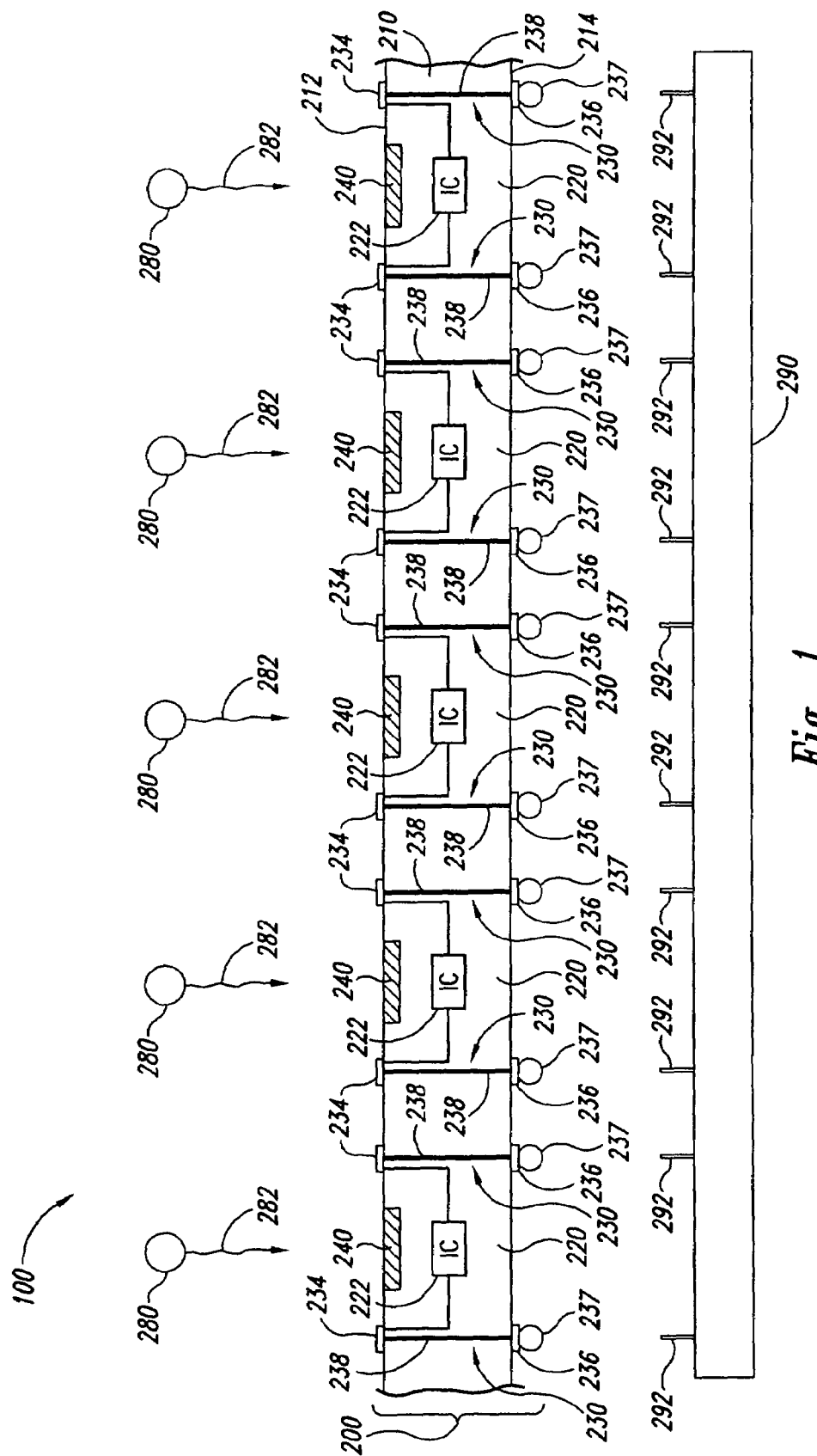
FIG. 1 is a schematic side cross-sectional view of a system for testing a plurality of microelectronic imaging dies in accordance with one embodiment of the invention.

The present invention is directed toward systems and methods for testing microelectronic imagers and microfeature devices. The term "microfeature device" is used throughout to include microelectronic devices, micromechanical devices, data storage elements, read/write components, and other articles of manufacture. For example, microfeature devices include SIMM, DRAM, flash-memory, ASICS, processors, flip chips, ball-grid array chips, and other types of electronic devices or components. Several specific details of the invention are set forth in the following description and in FIGS. 1-7 to provide a thorough understanding of certain embodiments of the invention. One skilled in the art, however, will understand that the present invention may have additional embodiments or that embodiments of the invention may be practiced without several of the specific features described below.

One aspect of the invention is directed to methods for testing microfeature devices and microelectronic imaging dies from a backside of a workpiece. In one embodiment, a method includes providing a microfeature workpiece including a substrate having a front side, a backside, and a plurality of microelectronic dies. The individual dies include an integrated circuit and a plurality of contact pads at the backside of the substrate operatively coupled to the integrated circuit. The method further includes contacting individual contact pads with corresponding pins of a probe card and testing the dies.

Another embodiment of a method for testing microfeature devices in accordance with the invention includes testing microelectronic imaging dies. The method comprises providing a microfeature workpiece including a substrate having a front side, a backside, and a plurality of microelectronic imaging dies. The individual dies include an image sensor, an integrated circuit electrically coupled to the image sensor, a plurality of contact pads at the backside of the substrate, and through-wafer interconnects extending at least partially through the substrate and electrically coupling corresponding contact pads to the integrated circuit. The method includes contacting individual contact pads at the backside of the substrate with corresponding pins of a probe card. The method then includes illuminating the image sensors while testing the dies.

Another embodiment of a method for testing microfeature devices in accordance with the invention includes testing the microfeature devices from both the front side and backside. The method comprises providing a microfeature workpiece including a substrate having a plurality of microelectronic dies. The individual dies have an integrated circuit, a plurality of terminals at the front side of the substrate operatively coupled to the integrated circuit, a plurality of contact pads at the backside of the substrate operatively coupled to the integrated circuit, and through-wafer interconnects extending through the substrate and electrically coupling the terminals to corresponding contact pads. The method further includes contacting individual terminals with corresponding pins of a first probe card while contacting individual contact pads with corresponding pins of a second probe card. The contact pads being contacted by the second probe card are not in electrical contact with the terminals being contacted by the first probe card. The method then includes testing the dies.

Another aspect of this invention is directed toward systems for testing microfeature devices and microelectronic imaging dies. One embodiment of a system in accordance with the invention comprises a microfeature workpiece including a substrate having a plurality of microelectronic dies. The individual dies include an integrated circuit and through-wafer interconnects extending through at least a portion of the substrate and operatively coupled to the integrated circuit. The dies further include a plurality of contact pads at the backside of the substrate and operatively coupled to the integrated circuit. The system also includes a probe card having a plurality of pins positioned to contact corresponding contact pads and test the dies.

B. Embodiments of Methods for Testing Microelectronic Imaging Dies

FIG. 1 is a schematic side cross-sectional view of a system 100 for testing a plurality of microelectronic imaging dies in accordance with an embodiment of the invention. The system 100 is configured for testing of a plurality of imaging dies to verify and ensure that the imaging dies function according to specification.

The system 100 illustrated in FIG. 1 includes a microfeature workpiece 200. The microfeature workpiece 200 includes a substrate 210 having a front side 212, a backside 214, and a plurality of imaging dies 220 formed on and/or in the substrate 210. The individual imaging dies 220 can include an image sensor 240, an integrated circuit 222 coupled to the image sensor 240, and external contacts 230 electrically coupled to the integrated circuit 222. The image sensors 240 can be CMOS image sensors or CCD image sensors for capturing pictures or other images in the visible spectrum, but in other embodiments the image sensors 240 can detect radiation in other spectrums (e.g., IR or UV ranges). The image sensors 240 are typically located at the front side 212 of the substrate 210.

The external contacts 230 shown in FIG. 1 provide a small array of ball-pads within the footprint of each imaging die 220. Each external contact 230, for example, can include a terminal 234 (e.g., a bond-pad), an external contact pad 236 (e.g., a ball-pad), and an interconnect 238 coupling the terminal 234 to the contact pad 236. In another aspect of this embodiment, a solder ball 237 is attached to each contact pad 236 to provide an external connection to other electronic devices (e.g., probe cards) on the backside 214 of the substrate 210. In other embodiments, the solder balls 237 may be omitted.

In the embodiment shown in FIG. 1, the terminals 234 are on the front side 212 of the substrate 210, the contact pads 236 are on the backside 214 of the substrate 210, and the interconnects 238 are through-wafer interconnects that extend completely through the substrate 210 to couple the terminals 234 to the contact pads 236 and corresponding solder balls 237. In other embodiments, however, the imaging dies 220 may not include the terminals 234 on the front side 212 of the substrate 210 such that the integrated circuit 222 is coupled directly to the contact pads 236 on the backside 214 of the substrate 210 by through-wafer interconnects that extend through only a portion of the substrate 210, or the terminals 234 can be within the substrate 210.

The system 100 further includes a probe card 290 positioned proximate the backside 214 of the substrate 210. In this disclosure, the term "probe card" may encompass a variety of architectures, including both rigid structures and flexible structures and including probe assemblies adapted for testing single microelectronic components and those adapted for testing multiple devices simultaneously, such as the system 100 illustrated in FIG. 1. The probe card 290 in the illustrated embodiment can be formed according to the methods disclosed in U.S. patent application Ser. No. 10/230,653, entitled "Probe Card, e.g., For Testing Microelectronic Components, and Methods for Making Same," filed on Aug. 29, 2002, now U.S. Pat. No. 6,773,938 issued Oct. 10, 2004 and herein incorporated by reference in its entirety.

The probe card 290 includes a plurality of pins 292 positioned to contact corresponding contact pads 236 and/or solder balls 237 on the individual dies 220. During testing, the pins 292 are in electrical communication with corresponding contact pads 236 and adapted to deliver and/or receive test signals (including source voltage, ground, etc.) to one more of the components being tested (e.g., image sensors 240). The pins 292 are typically either a length of wire or a spring-biased mechanism (e.g., pogo pins). The pins 292 can be arranged on the probe card 290 in an array corresponding to an array of the contact pads 236 and/or solder balls 237 on the backside 214 of the substrate 210.

The system 100 illustrated in FIG. 1 further includes a plurality of light sources 280 positioned above the front side 212 of the substrate 210 and configured to provide light 282 to the image sensors 240 on the imaging dies 220. During testing, light 282 impinges on the individual image sensors 240 to test the functionality of the image sensors 240 and to ensure that the image sensors 240 function according to specification. In the illustrated embodiment, the light 282 from the light sources 280 is visible light. In further embodiments, however, the image sensors 240 can be configured to detect radiation in other spectrums (e.g., IR or UV ranges). Accordingly, the light sources 280 can be radiation sources configured to produce IR- and/or UV-range radiation for testing the image sensors 240.

One feature of the illustrated system 100 is that the external contacts 230 provide arrays of contact pads 236 on the backside 214 of the substrate 210. Each array of contact pads 236 is operatively coupled to a corresponding image sensor 240. More specifically, the contact pads 236 can be located on the backside 214 of the substrate 210 because the interconnects 238 are through-wafer interconnects that extend to the backside 214 of a substrate 210. Accordingly, the backside arrays of contact pads 236 allow the imaging units 240 to be operably coupled to the probe card 290 on the backside 214 of the substrate 210. As such, the probe card 290 does not interfere with the image sensors 240 on the front side 212 of the substrate 210 during illumination and testing. Moreover, this feature allows a plurality of imaging dies 220 to be tested simultaneously without interference from neighboring probe cards 290 and/or pins 292. Further, the testing process can be more accurate because the image sensors 240 on the dies 220 can be fully illuminated without shadows or reflection from the probe card 290 and/or the pins 292.

Another feature of the illustrated system 100 is that by testing from the backside 214 of the substrate 210, potential contamination to the image sensors 240 on the front side 212 of the substrate 210 is mitigated or even eliminated. The image sensors 240 are very susceptible to damage from contamination because, as noted above, a particle as small as ten microns can effectively ruin an image sensor. By testing from the backside 214 of the substrate 210, particles cannot fall from the probe card 290 and/or pins 292 to the image sensors 240. Moreover, the image sensors 240 can be covered before testing from the backside contact pads 236 to provide complete protection of the image sensors 240.

C. Additional Embodiments of Methods for Testing Microelectronic Imaging Dies

Figure 2:
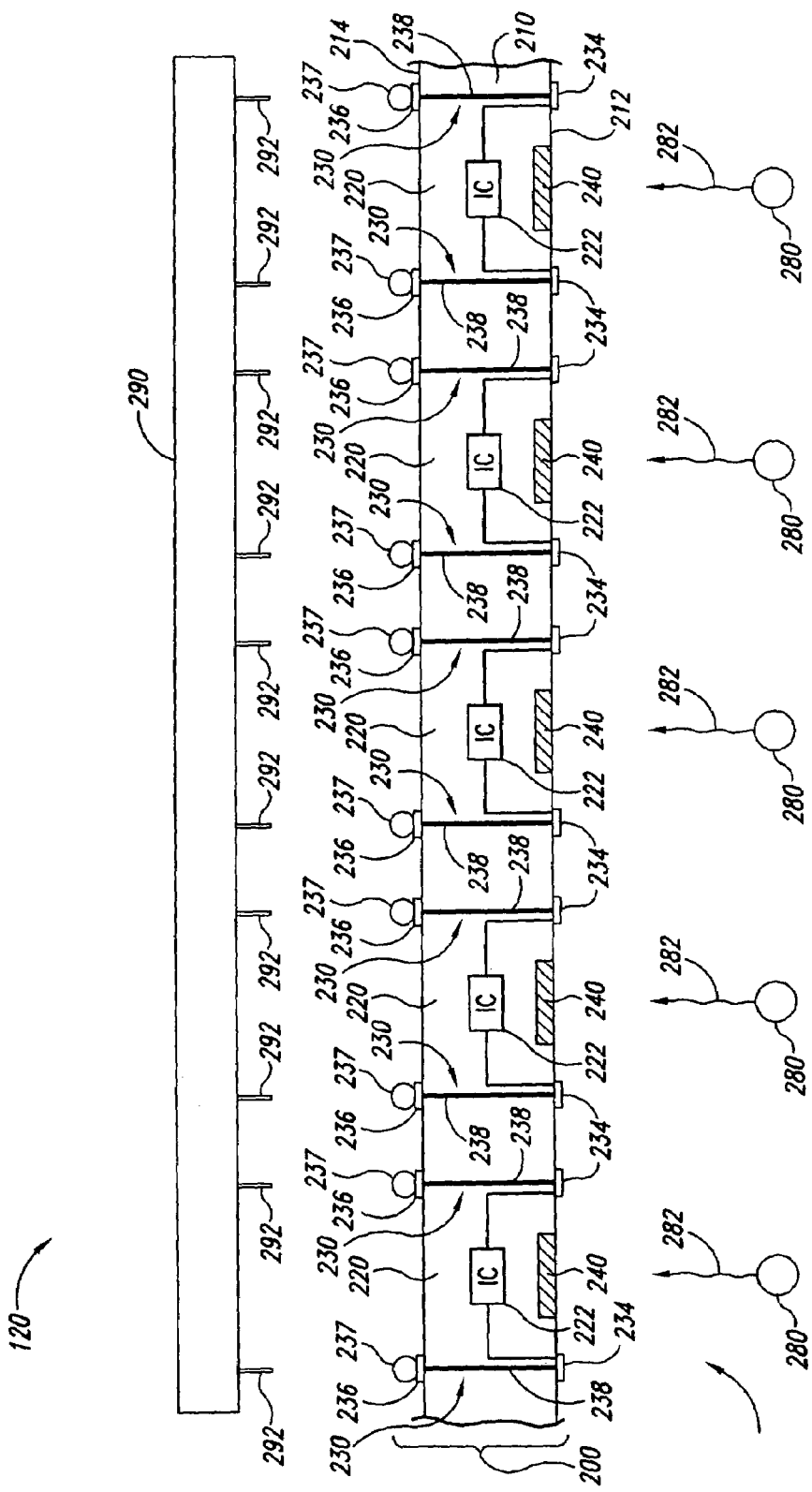
FIG. 2 is a schematic side cross-sectional view of a system for testing a plurality of microelectronic imaging dies in accordance with another embodiment of the invention.
Figure 3:
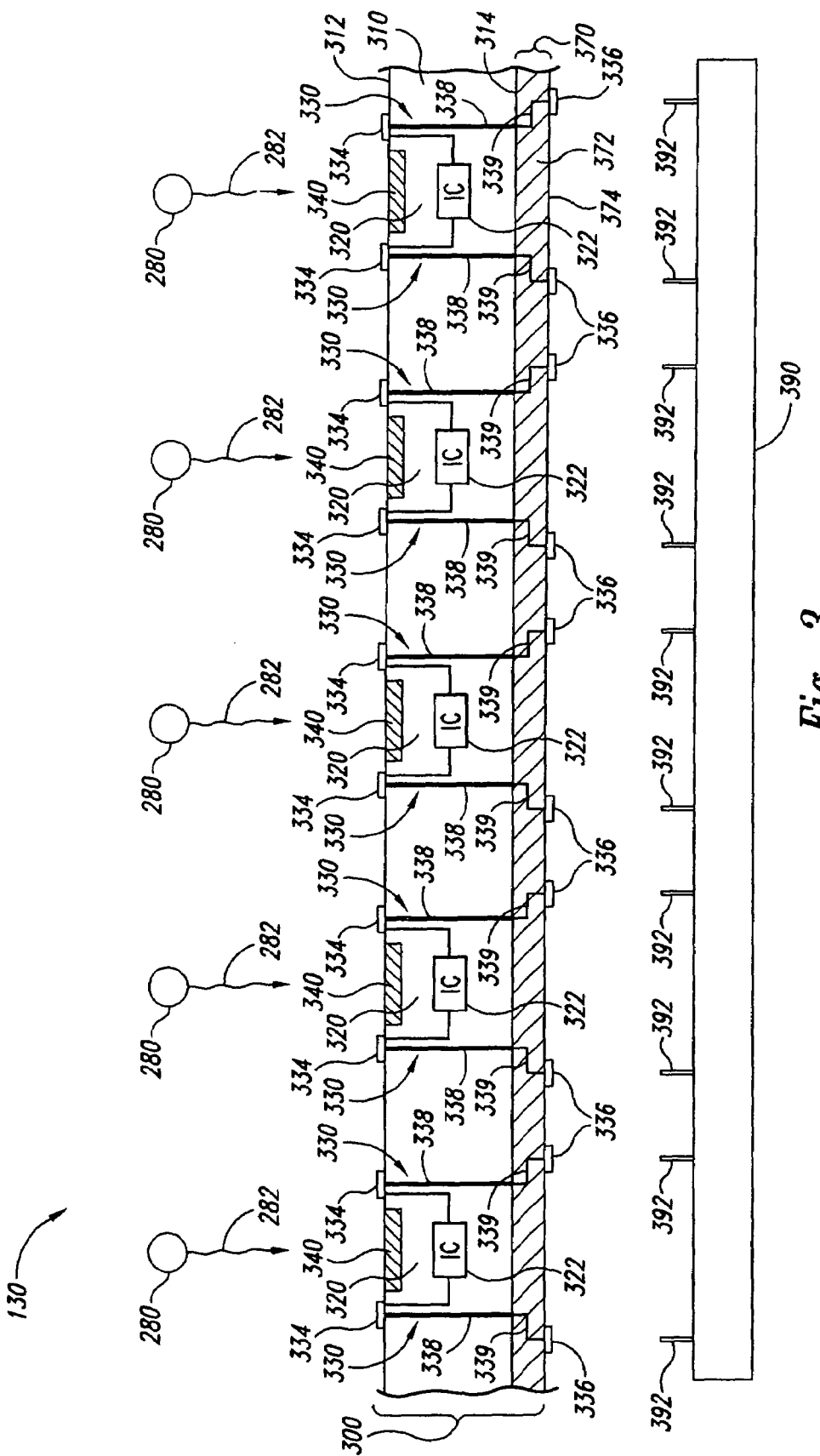
FIG. 3 is a schematic side cross-sectional view of a system for testing a plurality of microelectronic imaging dies in accordance with another embodiment of the invention.
Figure 4:
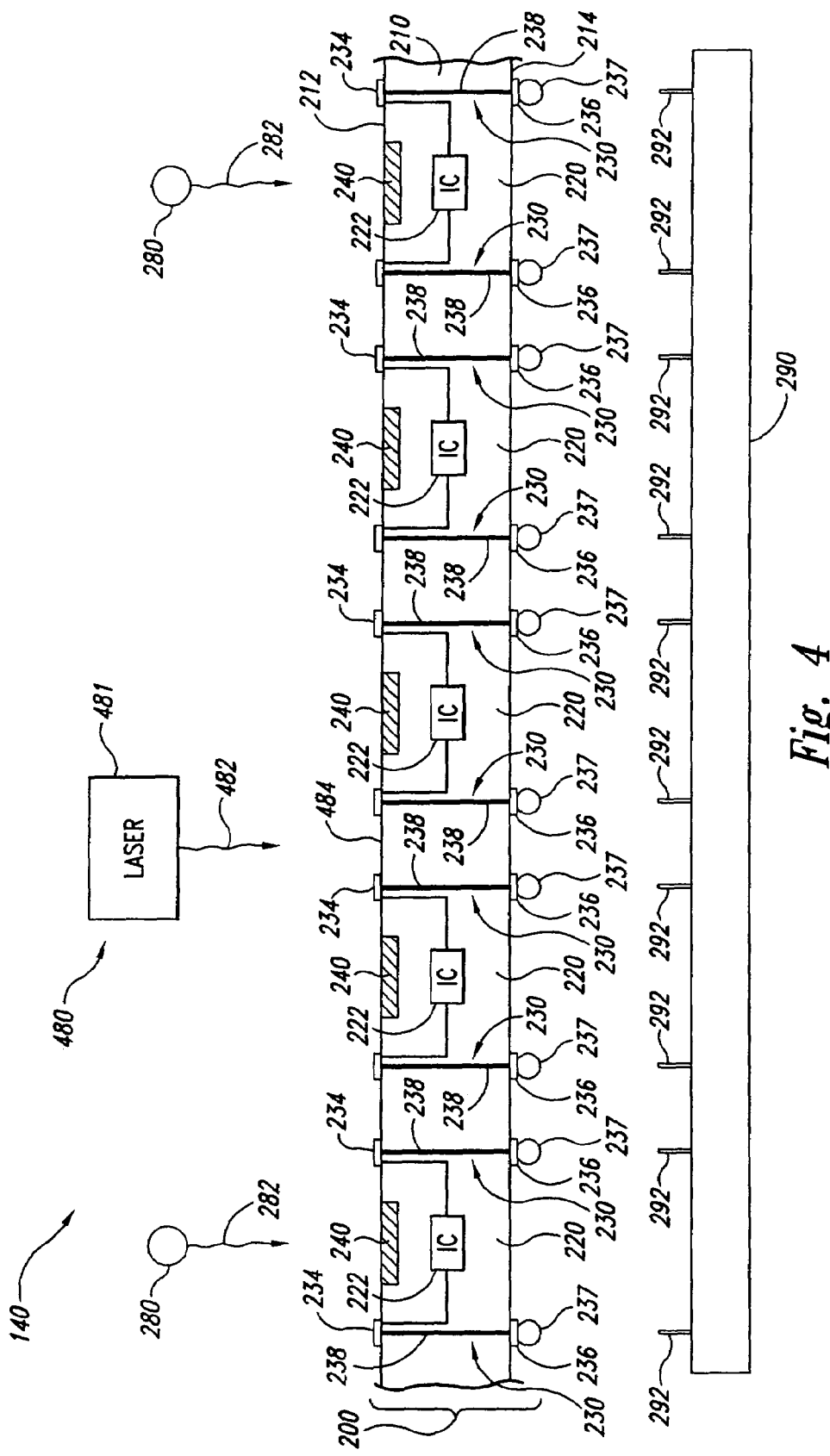
FIG. 4 is a schematic side cross-sectional view of a system for testing a plurality of microelectronic imaging dies while simultaneously repairing fuses on a workpiece in accordance with one embodiment of the invention.

FIGS. 2-4 illustrate several alternative embodiments of systems for testing microelectronic imaging dies. In each of FIGS. 2-4, many of the features may be the same as those discussed above in connection with the system 100 in FIG. 1. Accordingly, like reference numbers are used to refer to like components in FIG. 1 and in FIGS. 2-4.

FIG. 2 is a schematic side cross-sectional view of a system 120 for testing a plurality of microelectronic imaging dies in accordance with another embodiment of the invention. The system 120 includes the microfeature workpiece 200, the probe card 290, and the light sources 280 described above with respect to FIG. 1. The primary difference between the system 120 shown in FIG. 2 and the system 100 shown in FIG. 1 is that the orientation of the microfeature workpiece 200 is inverted in the system 120. More specifically, the front side 214 of the substrate 210 in this embodiment is oriented in a generally downward direction, as opposed to the generally upward orientation of the front side 214 of the substrate 210 in the system 100. The probe card 290 and the light sources 280 in the illustrated embodiment are rearranged accordingly. One feature of this embodiment is that potential contamination of the image sensors 240 is further mitigated. Because the image sensors 240 on the front side 214 of the substrate 210 are oriented in a generally downward direction, debris is less likely to accumulate on the front side 214 of the substrate 210 and/or the image sensors 240 compared to the face-up orientation shown in FIG. 1. Accordingly, the inverted orientation of the system 120 in the illustrated embodiment can enhance the protection of the image sensors 240 during testing.

FIG. 3 is a schematic side cross-sectional view of a system 130 for testing a plurality of microelectronic imaging dies in accordance with another embodiment of the invention. In one aspect of this embodiment, the system 130 includes a microfeature workpiece 300 and a probe card 390 generally similar to the components described above with respect to FIG. 1. The microfeature workpiece 300 includes a substrate 310 having a front side 312, a backside 314, and a plurality of imaging dies 320 formed on and/or in the substrate 310. The individual imaging dies 320 can include an image sensor 340, an integrated circuit 322 electrically coupled to the image sensor 340, and external contacts 330 electrically coupled to the integrated circuit 322.

The external contacts 330 shown in FIG. 3 can be generally similar to the external contacts 230 described above with respect to FIG. 1. Each external contact 330, for example, can include a terminal 334 (e.g., a bond-pad) at the front side 312 of the substrate 310 and an interconnect 338 in contact with the terminal 334 and extending through the substrate 310. The workpiece 300, however, differs from the workpiece 200 shown in FIG. 1 in that the external contacts on the backside 314 of the substrate 310 are of such a fine pitch that a redistribution assembly 370 is formed on the substrate 310. The redistribution assembly 370 includes a dielectric layer 372, a plurality of ball-pads 336 at a backside 374 of the redistribution assembly 370, and a plurality of traces 339 electrically coupling the ball-pads 336 to corresponding interconnects 338. Accordingly, the ball-pads 336 provide an external connection to other electronic devices (e.g., probe cards). In another aspect of this embodiment, a solder ball (not shown) or other conductive element can be attached to each ball-pad 336.

The probe card 390 has a plurality of pins 392 positioned at the backside 314 of the substrate 310. The probe card 390 differs from the probe card 290 shown in FIG. 1 in that the arrangement of the pins 392 on the probe card 390 is different. The pins 392 can be arranged in an array corresponding to the ball-pads 336 on the redistribution assembly 370. In another aspect of the embodiment illustrated in FIG. 3, the system 130 can further include the light sources 280 positioned above the front side 312 of the substrate 310 and configured to provide light 282 to the image sensors 340 on corresponding imaging dies 320.

One feature of the illustrated embodiment is that the redistribution assembly 370 provides arrays of ball-pads 336 that are spaced farther apart and have more surface area than the contact pads 236 shown in FIG. 1. This feature is particularly important when positioning and attaching the pins 392 of the probe card 390 to ball-pads arranged in the high-density, fine pitch arrays that are common in high-performance imagers.

FIG. 4 is a schematic side cross-sectional view of a system 140 in accordance with another embodiment of the invention. In one aspect of this embodiment, the system 140 can include the microfeature workpiece 200 and the probe card 290 described above in FIG. 1. The system 140 differs from the system 100 described above with respect to FIG. 1 in that the system 140 further includes a repair apparatus 480 to fuse repair electrical connections on the substrate 210. The repair apparatus 480 in the illustrated embodiment includes a laser 481 (shown schematically) that directs laser light 482 onto an antifuse 484 at the front side 212 of the substrate 210. The laser light 482 irradiates the antifuse 484 on the substrate 210, thus reflowing the antifuse 484 and restoring the electrical connection to a failed connection on the dies 220. In other embodiments, the repair apparatus 480 can have other configurations and/or irradiate the antifuse 484 in a different manner. One feature of the illustrated embodiment is that the fuse repair process can take place at one location on the front side 212 of the substrate 210, while testing of the imaging dies 220 is taking place at another location on the front side 212 of the substrate 210. Accordingly, the simultaneous repair/testing processes can result in faster throughput and lower manufacturing costs.

D. Additional Embodiments of Methods for Testing Microfeature Devices

Figure 5:
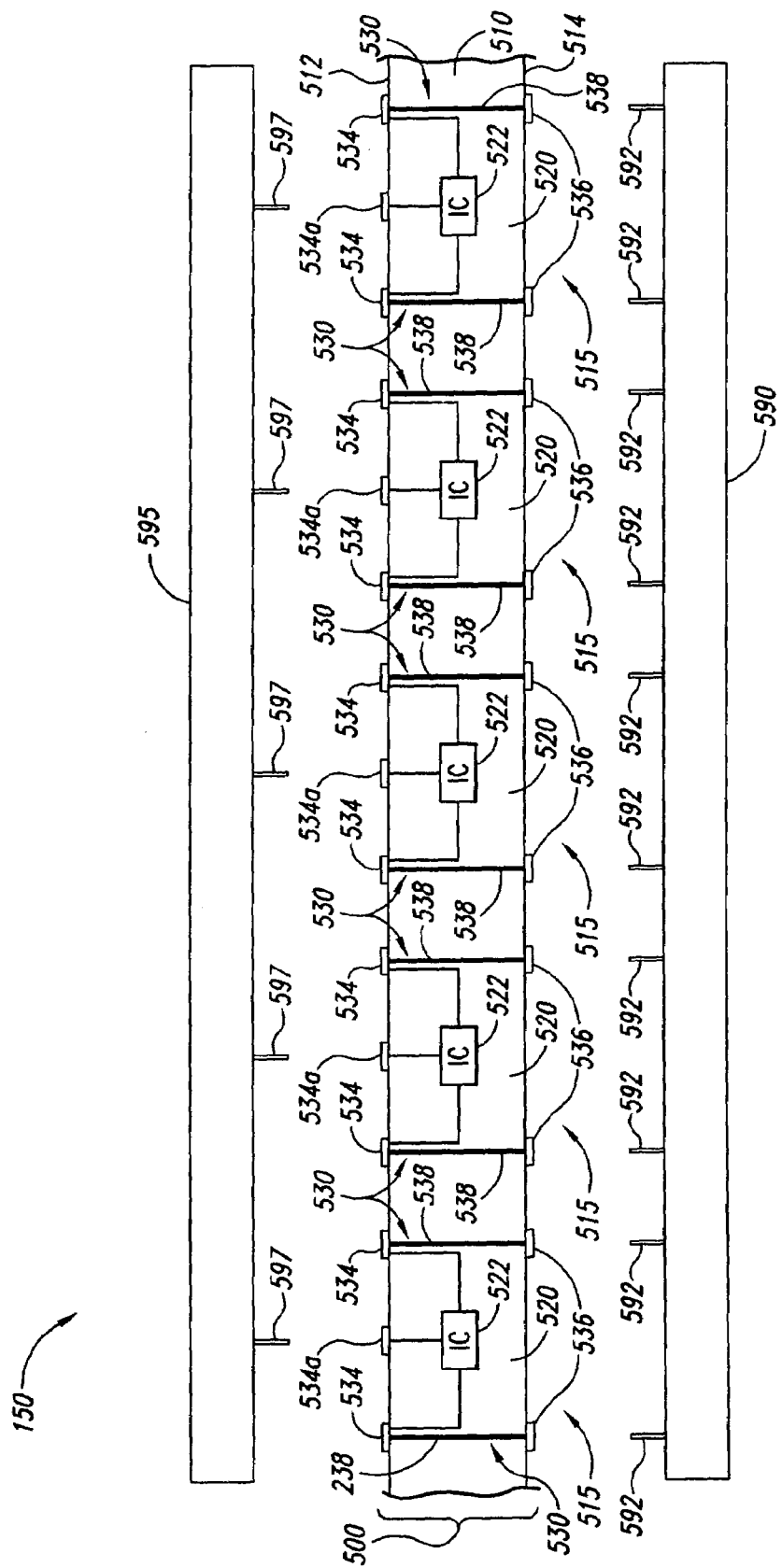
FIG. 5 is a schematic side cross-sectional view of a system for testing a plurality of microfeature devices in accordance with one embodiment of the invention.
Figure 6:
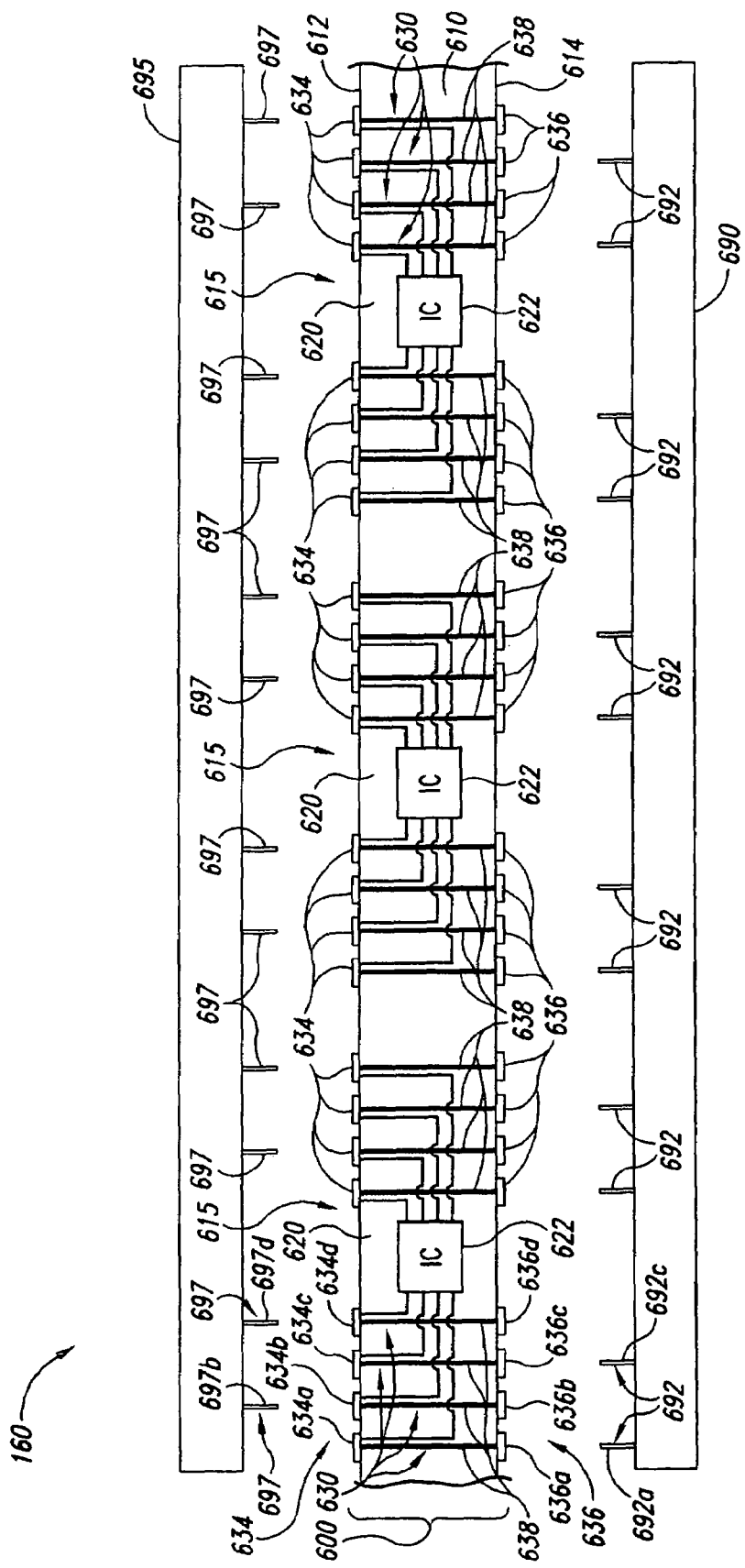
FIG. 6 is a schematic side cross-sectional view of a system for testing a plurality of microfeature devices in accordance with one embodiment of the invention.
Figure 7:
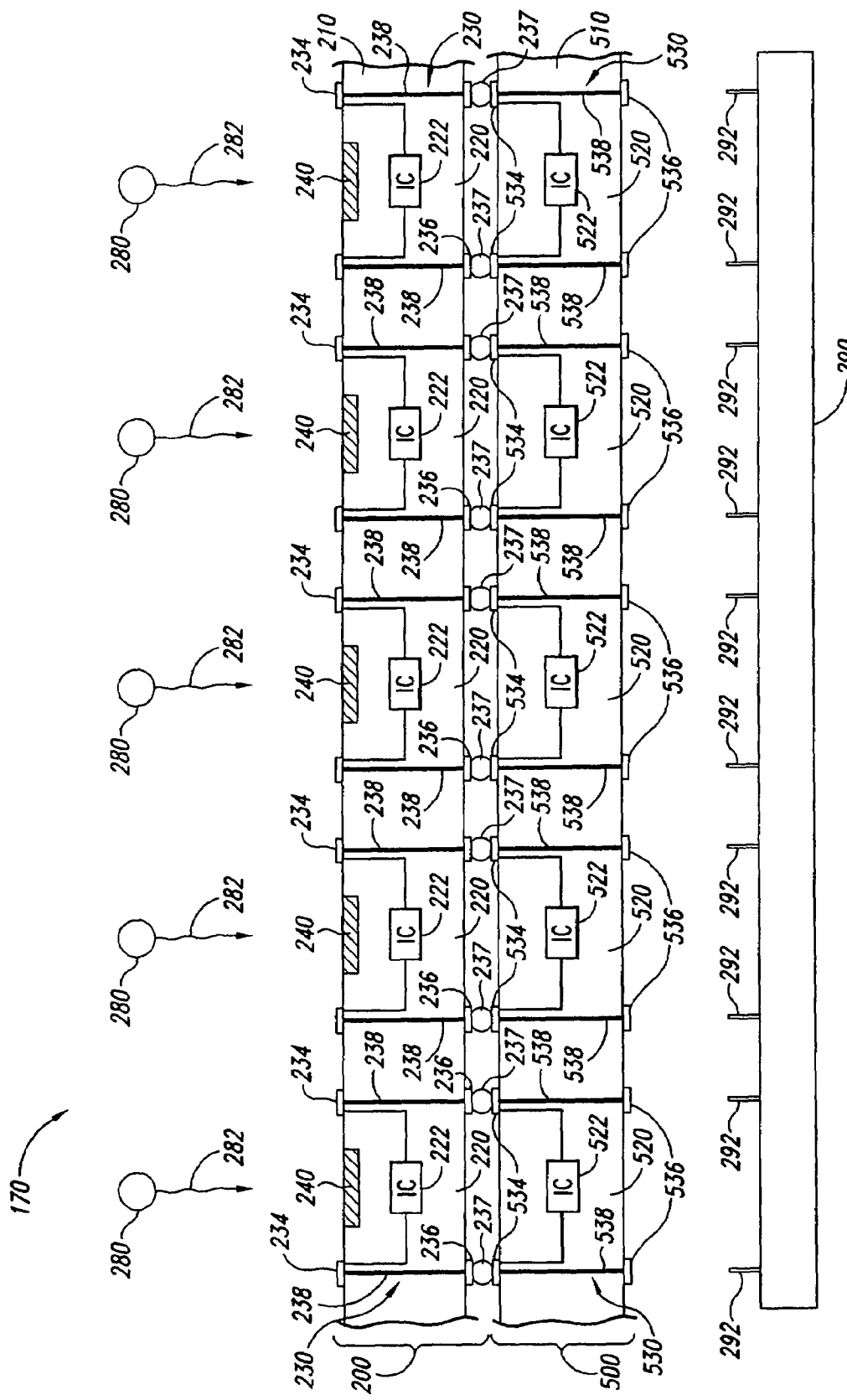
FIG. 7 is a schematic side cross-sectional view of a system for testing a plurality of microelectronic imaging dies along with a plurality of microfeature devices in accordance with one embodiment of the invention.

FIGS. 5-7 illustrate systems for testing microfeature devices in accordance with additional embodiments of the invention. For example, FIG. 5 is a schematic side cross-sectional view of a system 150 including a microfeature workpiece 500 and two probe cards 590, 595 configured for testing microfeature devices 515 on the workpiece 500. The system 150 differs from the system 100 shown above in FIG. 1 in that the microfeature devices 515 on the workpiece 500 do not include image sensors.

The microfeature workpiece 500 in the illustrated embodiment includes a substrate 510 having a front side 512, a backside 514, and a plurality of microfeature devices 515 formed on and/or in the substrate 510. The individual microfeature devices 515 include a microelectronic die 520 having an integrated circuit 522 and a plurality of external contacts 530 electrically coupled to the integrated circuit 522.

The external contacts 530 can be generally similar to the external contacts 230 described above with respect to FIG. 1. Each external contact 530, for example, can include a terminal 534 (e.g., a bond-pad), an external contact pad 536 (e.g., a ball-pad), and an interconnect 538 coupling the terminal 534 to the contact pad 536. In the embodiment shown in FIG. 5, the terminals 534 are on the front side 512 of the substrate 510, the contact pads 536 are on the backside 514 of the substrate 510, and the interconnects 538 are through-wafer interconnects that extend completely through the substrate 510 to couple the terminals 534 to corresponding contact pads 536.

In another aspect of this embodiment, the individual dies 520 include some terminals 534 (e.g., terminals 534a) at the front side 512 of the substrate 510 that are not in contact with interconnects 538 extending through the substrate 510. As such, terminals 534a must be tested from the front side 512 of the substrate 510. Accordingly, the system 150 includes a first probe card 590 at the backside 514 of the substrate 510 and a second probe card 595 at the front side 512 of the substrate 510. The first probe card 590 includes a plurality of pins 592 positioned to contact corresponding contact pads 536 on the backside 514 of the substrate 510, while the second probe card 595 includes a plurality of pins 597 positioned to contact terminals 534a on the front side 512 of the substrate 510. During testing, the pins 592, 597 are in electrical communication with the dies 520 and adapted to deliver and/or receive test power (including test signals) to one more of the components of the dies 520. The pins 592, 597 can be arranged on the first and second probe cards 590, 595 in arrays corresponding to the arrays of corresponding contact pads 536 and terminals 534, 534a on the substrate 510.

One feature of the embodiment illustrated in FIG. 5 is that the use of multiple probe cards provides for simultaneous testing of both terminals 534 coupled to interconnects 538 and terminals 534a not coupled to interconnects 538. Accordingly, this feature provides flexibility in the testing process in that microelectronic dies having terminals with and without connections to interconnects can be tested quickly and without additional steps being required in the testing process. Furthermore, this feature minimizes the amount of time it takes to test a workpiece since testing can occur from both the front side and the backside of the substrate.

FIG. 6 is a schematic side cross-sectional view of a system 160 in accordance with another embodiment of the invention. In the illustrated embodiment, the system 160 can include a microfeature workpiece 600 with a substrate 610 having a front side 612, a backside 614, and a plurality of microfeature devices 615 formed on and/or in the substrate 610. The microfeature devices 615 can be generally similar to the devices 515 described above with respect to FIG. 5. The individual microfeature devices 615 have a microelectronic die 620 including an integrated circuit 622 and a plurality of external contacts 630 electrically coupled to the integrated circuit 622. Each external contact 630 can include a terminal 634 (e.g., a bond-pad) on the front side 612 of the substrate 610, an external contact pad 636 (e.g., a ball-pad) on the backside 614 of the substrate 610, and a through-wafer interconnect 638 extending completely through the substrate 610 coupling the terminals 634 to corresponding contact pads 636.

The system 160 further includes a first probe card 690 having a plurality of pins 692 positioned proximate the backside 614 of the substrate 610 and a second probe card 695 having a plurality of pins 697 positioned proximate the front side 612 of the substrate 610. The pins 692, 697 can be arranged on the first and second probe cards 690, 695 in arrays corresponding to the arrays of contact pads 636 and terminals 634 on the substrate 610.

The external contacts 630 in the illustrated embodiment differ from the external contacts 530 shown in FIG. 5 in that density of the terminals 634 on the front side 612 of the substrate 610 is so great (e.g., having approximately zero pitch) that the terminals 634 cannot all be tested from one side of the substrate 610. Accordingly, the terminals 634 must be tested by probing alternate front side terminals 634 and backside contact pads 636.

For example, pins 692a and 692c on the first probe card 690 are in electrical communication with contact pads 636a and 636c (and accordingly terminals 634a and 634c via interconnects 638). Terminals 634b and 634d, however, are not in electrical communication with probe card 690. Rather, terminals 634b and 634d (and accordingly contact pads 636b and 636d via interconnects 638) are contacted by pins 697b and 697d on the second probe card 695. Accordingly, a plurality of dies 620 having fine-pitch arrays can be tested simultaneously by probing alternating terminals 634 and contact pads 636 on both the front side 612 and the backside 614 of the substrate 610, even though the arrays of terminals 634 and/or contact pads 636 on the individual dies 620 are too dense for the probe cards 690, 695. Furthermore, construction of the probe cards 690, 695 can be simplified because each probe card will not have to be configured to test the entire high-density array. Rather, individual probe cards will only require enough pins to test alternate electrical contacts on corresponding sides of the substrate 610.

From the foregoing, it will be appreciated that specific embodiments of the invention have been described herein for purposes of illustration, but that various modifications may be made without deviating from the spirit and scope of the invention. Furthermore, various aspects of any of the foregoing embodiments can be combined in different combinations. FIG. 7, for example, illustrates a system 170 that is a combination of the microfeature workpiece 200, probe card 290, and light sources 280 shown in FIG. 1 with the microfeature workpiece 500 from FIG. 5. The imaging dies 220 and microelectronic dies 520 can be tested together as shown. Accordingly, the invention is not limited except as by the appended claims.

We claim:

1. A method for testing a plurality of microfeature devices, comprising:
providing a microfeature workpiece including a substrate having a front side, a backside, and a plurality of microelectronic dies, the individual dies including an integrated circuit, a plurality of terminals at the front side of the substrate operatively coupled to the integrated circuit, a plurality of contact pads at the backside of the substrate operatively coupled to the integrated circuit, and through-wafer interconnects extending through the substrate and electrically coupling the terminals to corresponding contact pads;
contacting individual terminals with corresponding pins of a first probe card;
contacting individual pads with corresponding pins of a second probe card, wherein the contact pads being contacted by the second probe card are not in electrical contact with the terminals being contacted by the first probe card; and
testing the dies.

2. The method of claim 1 providing the terminals at the first side of the substrate comprises providing terminals in arrays having approximately zero pitch.

3. The method of claim 1, further comprising:
attaching a plurality of solder balls to corresponding contact pads; and
contacting the individual solder balls with corresponding pins of the first probe card.

4. The method of claim 1 wherein testing the dies comprises delivering test power to the contact pads while corresponding pins are in contact with the contact pads.

5. The method of claim 1 wherein the individual dies further comprise an image sensor at the front side of the substrate, the image sensor being electrically coupled to the integrated circuit.

6. The method of claim 5 further comprising:
providing a light source proximate the front side of the substrate for illuminating the image sensors while testing the dies.

7. The method of claim 1 wherein the front side of the substrate is oriented in a downward direction such that the front side of the substrate is shielded from falling debris.

8. A system for testing a plurality of microfeature devices, the system comprising:
a microfeature workpiece including a substrate having a front side, a backside, and a plurality of dies, the individual dies having an integrated circuit, a plurality of terminals at the front side of the substrate and electrically coupled to the integrated circuit, a plurality of contact pads at the backside of the substrate, and a plurality of through-wafer interconnects extending through the die and electrically coupling the terminals with corresponding contact pads;
a first probe card having a plurality of first pins, the first pins being positioned to contact corresponding terminals at the front side of the substrate; and
a second probe card including a plurality of second pins, the second pins being positioned to contact corresponding contact pads at the backside of the substrate simultaneous with the first pins contacting the terminals at the front side of the substrate.

9. The system of claim 8 wherein the terminals contacted by the first probe card are not in electrical communication with the contact pads and/or interconnects contacted by the second probe card.

10. The system of claim 8 wherein the terminals are in arrays having approximately zero pitch.

11. The system of claim 8 wherein the front side of the substrate is oriented in a downward direction such that the front side of the substrate is shielded from falling debris.

12. A system for testing a plurality of microfeature devices, the system comprising:
a first microfeature workpiece including a first substrate having a front side, a backside, and a plurality of dies, the individual dies having an integrated circuit, a plurality of terminals at the front side of the first substrate and electrically coupled to the integrated circuit, a plurality of contact pads at the backside of the first substrate, and a plurality of through-wafer interconnects extending through the die and electrically coupling the terminals with corresponding contact pads;
a first probe card having a plurality of first pins, the first pins being positioned to contact corresponding terminals at the backside of the first substrate;
a second probe card including a plurality of second pins; and
a fuse repair apparatus having a laser positioned to irradiate an antifuse and restore electrical communication between the antifuse and a first die.

13. The system of claim 12 wherein the terminals contacted by the first probe card are not in electrical communication with the contact pads and/or interconnects contacted by the second probe card.

14. The system of claim 12 wherein the terminals are in arrays having approximately zero pitch.

15. The system of claim 12, further comprising:
a second microfeature workpiece having a second substrate with a front side, a backside, and a plurality of microelectronic dies, the individual dies comprising image sensors, integrated circuits electrically coupled to the image sensors, and a plurality of external electrical contacts electrically coupled to the integrated circuits, the first and second substrates being assembled together so that the external electrical contacts at the backside of the second substrate contact corresponding terminals at the front side of the first substrate, and wherein the first substrate is in electrical communication with the second substrate.

16. The system of claim 15, further comprising:
a light source positioned above the front side of the second substrate to illuminate the image sensors during testing.

17. The system of claim 15 wherein the second pins are positioned to contact corresponding contact pads at the front side of the second substrate simultaneous with the first pins contacting the terminals at the backside of the first substrate.

18. The system of claim 12, further comprising:
a redistribution assembly at the backside of the first substrate, the redistribution assembly having a dielectric layer over the backside of the first substrate, a plurality of ball-pads, and traces electrically coupling the ball-pads with corresponding contact pads, and wherein the pins on the first probe card are positioned to contact corresponding ball-pads.

19. The system of claim 15, further comprising:

a redistribution assembly at the backside of the second substrate, the redistribution assembly having a dielectric layer over the backside of the second substrate, a plurality of ball-pads, and traces electrically coupling the ball-pads with corresponding contact pads, and wherein the terminals on the front side of the first substrate are positioned to contact corresponding ball-pads on the backside of the second substrate.

20. The system of claim 12 wherein the second pins are positioned to contact corresponding contact pads at the front side of the first substrate simultaneous with the first pins contacting the terminals at the backside of the first substrate.

\* \* \* \* \*